United States Patent [19]

Durley, III

[11] 4,038,570

[45] July 26, 1977

[54] ULTRASONIC PIEZOELECTRIC TRANSDUCER DRIVE CIRCUIT

[76] Inventor: Benton A. Durley, III, Rte. 45, Druce Lake, P.O. Box 304, Grayslake, Ill. 60030

[21] Appl. No.: 652,228

[22] Filed: Jan. 26, 1976

Related U.S. Application Data

[62] Division of Ser. No. 525,487, Nov. 20, 1974, abandoned.

[51] Int. Cl.[2] .............................................. H01L 41/04

[52] U.S. Cl. .............................................. 310/8.1

[58] Field of Search .......................... 310/8.1; 318/116

[56] References Cited

U.S. PATENT DOCUMENTS

| | | | |
|---|---|---|---|
| 3,155,141 | 11/1964 | Doyle et al. | 310/8.1 X |
| 3,432,691 | 3/1969 | Shoh | 310/8.1 |
| 3,489,930 | 1/1970 | Shoh | 310/8.1 |
| 3,651,352 | 3/1972 | Puskas | 310/8.1 |
| 3,809,977 | 5/1974 | Balamuth et al. | 310/8.1 |

*Primary Examiner*—Mark O. Budd

*Attorney, Agent, or Firm*—Burmeister, York, Palmatier, Hamby & Jones

[57] ABSTRACT

An ultrasonic piezoelectric device is disclosed, comprising a piezoelectric transducer having at least one piezoelectric element having a pair of electrodes on opposite sides of the element, a solid-state amplifier having input and output connections, a driver transformer having a primary winding connected to said output connection of the solid-state amplifier, the driver transformer having a secondary winding connected to the electrodes of the piezoelectric transducer, a feedback transformer having a secondary winding connected to the input connection of the solid-state amplifier, the feedback transformer having a primary winding, and a phase shifting circuit connected between the primary winding of the feedback transformer and the electrodes of the piezoelectric transducer.

7 Claims, 9 Drawing Figures

FIG. 3
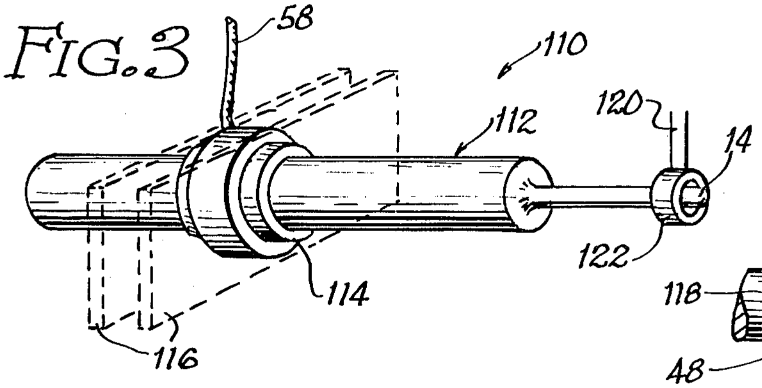
FIG. 5
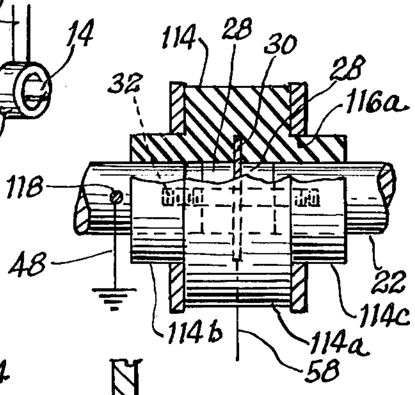
FIG. 6
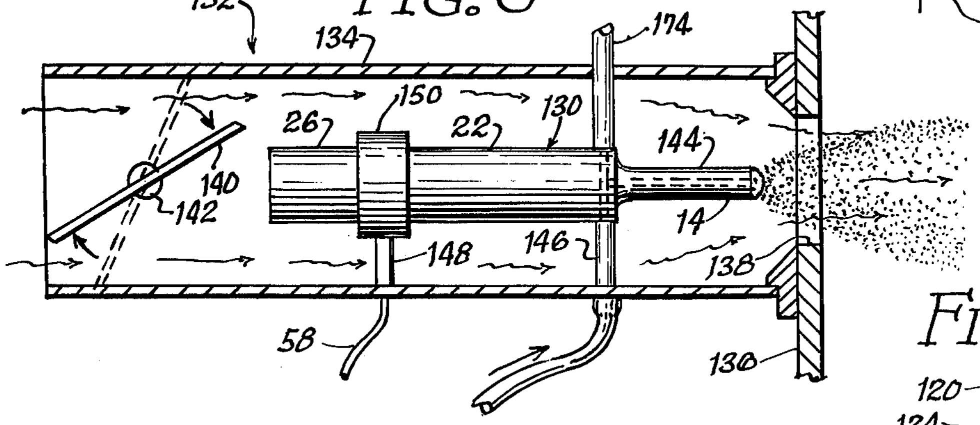
FIG. 4
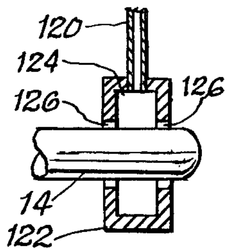
FIG. 7
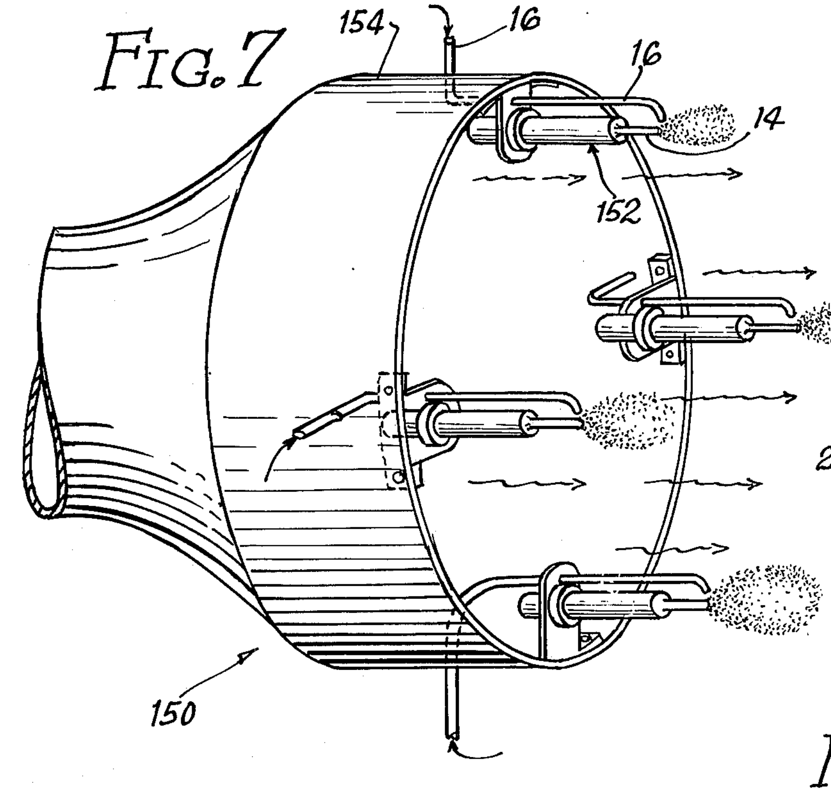
FIG. 8
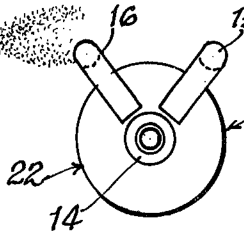
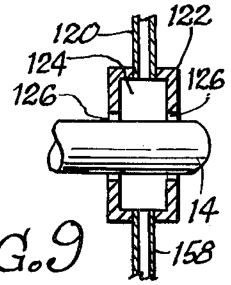
FIG. 9

ULTRASONIC PIEZOELECTRIC TRANSDUCER DRIVE CIRCUIT

This application is a division of my copending application, Ser. No. 525,487, filed Nov. 20, 1974 now abandoned, and also contains new subject matter.

This invention relates to ultrasonic transducer devices which are applicable to humidifiers, atomizers and the like, adapted to atomize water, gasoline and other liquids, so as to produce a large amount of extremely small particles of the liquid. The transducer devices are also applicable to ultrasonic snow-making apparatus, bleaching devices, cleaning devices, erasers, cutting devices, drilling devices, sewing devices, heating devices, steam generating devices and distilling devices.

One object of the present invention is to provide an extremely dependable, efficient, economical and compact ultrasonic piezoelectric transducer device capable of producing an abundance of ultrasonic vibratory energy with very low power consumption.

To achieve this and other objects, the present invention provides a device comprising a piezoelectric transducer having at least one piezoelectric element, a pair of electrodes on opposite sides of the element, a solid-state amplifier having input and output connections, a driver transformer having a primary winding connected to the output connection of the solid-state amplifier, the driver transformer having a secondary winding connected to the electrodes of the piezoelectric transducer, a feedback transformer having a secondary winding connected to the input connection of the solid-state amplifier, the feedback transformer having a primary winding, and a phase shifting circuit connected between the primary winding of the feedback transformer and the electrodes of the piezoelectric transducer. The solid-state amplifier preferably comprises a Darlington transistor amplifier having a plurality of coupled transistors combined in a single module, but the solid-state amplifier may also utilize other devices, such as a single transistor. The phase shifting circuit preferably includes a variable element for controlling the magnitude of the feedback signal. Such variable element may take the form of a variable potentiometer connected in series with a capacitor across the electrodes of the piezoelectric transducer. The potentiometer may have a variable output element connected to the primary winding of the feedback transformer. A resonating capacitor is preferably connected to the secondary of the feedback transformer.

The transducer imparts ultrasonic vibrations to a vibratory member, to which a nonstick wear-resistant coating is preferably applied. Such coating is preferably made of Teflon or some other plastic material, but the coating may also take the form of an anodized aluminum coating on a vibratory member made of aluminum. When the transducer is employed to atomize water, the nonstick coating prevents any accumulation of lime or other minerals on the vibratory member, while also preventing corrosion, discoloration and erosion of the vibratory member.

The solid-state amplifier may be provided with electrical power by a power supply which may include a voltage dropping resistance element, located on or near the vibratory member, so that the heat generated in the resistance element will be imparted to the water or other liquid atomized by the ultrasonic vibrations. The heat accelerates the vaporization of the water or other liquid. A nonstick or wear-resistant coating is preferably applied to the resistance element.

Further objects, advantages and features of the present invention will appear from the following description, taken with the accompanying drawings, in which:

FIG. 3 is perspective view showing a modified humidifier.

FIG. 4 is a fragmentary enlarged sectional view taken through the tip portion of the humidifier shown in FIG. 3.

FIG. 5 is an enlarged longitudinal view, partly in section, showing the mounting for the ultrasonic transducer of FIG. 3.

FIG. 6 is a longitudinal section showing a carburetor utilizing an ultrasonic transducer to atomize gasoline, in accordance with the present invention.

FIG. 7 is a fragmentary perspective view showing a device utilizing a plurality of ultrasonic atomizers in a system for producing artificial snow.

FIG. 8 is a front view of a modified atomizing device which is somewhat similar to the device shown in FIG. 1, but makes provision for atomizing a plurality of liquids.

FIG. 9 is a view similar to FIG. 4, but showing another modified construction for atomizing a plurality of liquids.

Figure 1:
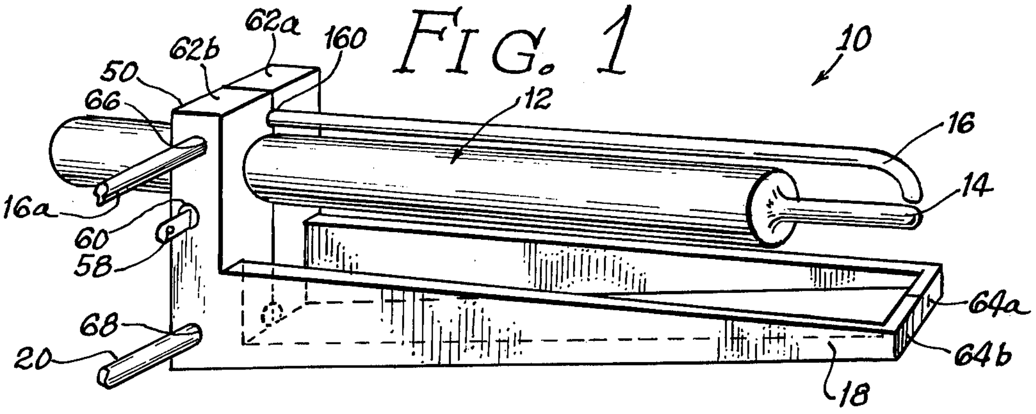
FIG. 1 is a perspective view of an ultrasonic humidifier to be described as an illustrative embodiment of the present invention.

As just indicated, FIG. 1 illustrates an ultrasonic humidifier 10 which can also be used for atomizing liquids other than water. The humidifier 10 comprises an ultrasonic transducer 12 including a vibratory member 14, together with means for imparting ultrasonic vibrations to such vibratory member.

The humidifier 10 also includes means for supplying water or some other liquid to the vibratory member 14. When the water comes into contact with the vibratory member 14, the ultrasonic vibrations thereof cause the water to be broken up into a large number of extremely small particles or droplets which are propagated away from the vibratory member 14. The droplets rapidly evaporate so as to increase the humidity of the atmosphere around the vibratory member 14.

In this case, a tube or pipe 16 is provided to direct the water or other liquid to the outside of the vibratory member 14. The end of the tube 16 comes close to the vibratory member 14 but is preferably spaced therefrom. Preferably, the end of the tube 16 is close to the vibratory member 14 so that the water or other liquid will move into contact with the vibratory member. It is not necessary to upon gravity to move the liquid into contact with the vibratory member, because it has been found that the liquid will travel upwardly by capillary attraction to the vibratory member, if the end of the supply tube 16 is close to the vibratory member so that the meniscus of the liquid comes into contact with the vibratory member. During normal operation of the humidifier 10, all of the water supplied by the tube 16 is atomized to form a cloud of extremely small water droplets. However, to collect the water when the vibratory member 14 is not being supplied with ultrasonic energy, a collection receptacle 18 is preferably provided below the vibratory member 14. Any unatomized water drops into the receptacle 18, which may be in the form of a pan, tray or trough. Preferably, the receptable 18 is provided with a drain, which may take the form of a tube or pipe 20.

Figure 2:
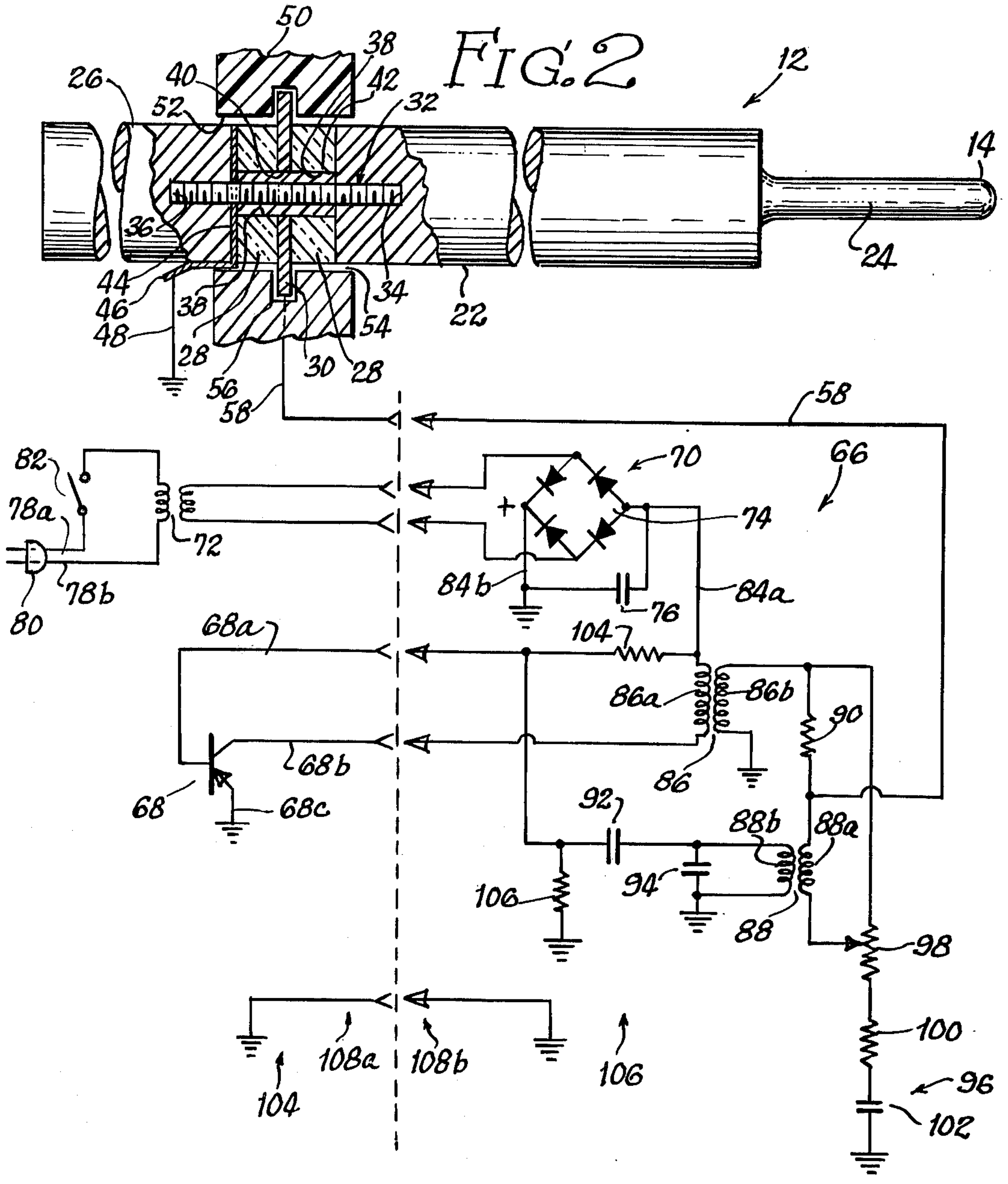
FIG. 2 is a fragmentary enlarged sectional view showing the ultrasonic transducer for the humidifier of FIG. 1, while also showing a drive circuit for producing ultrasonic electrical power to energize the transducer.

Additional details of the ultrasonic transducer 12 are shown in FIG. 2. As shown, the vibratory member 14 takes the form of the tip portion of an elongated front end mass 22, which is shown as being made of metal, but may be made of other suitable materials. An illustrated front end mass 22 is generally cylindrical in shape and is circular in cross-section. The front end mass 22 has a front end portion 24 which is reduced in cross-section. The vibratory member 14 is shown as the tip portion of the reduced member 24. The provision of the reduced member 24 greatly intensifies the ultrasonic vibrations of the tip portion 14.

The illustrated ultrasonic transducer 12 also comprises an elongated tail mass 26 which is also preferably cylindrical and circular in cross section. The elongated tail mass 26 is preferably made of metal but may be made of other suitable materials.

Ultrasonic vibratory energy is supplied to the transducer 12 by suitable means, illustrated as comprising one or more piezoelectric elements. In this case, there are two piezoelectric elements 28 which are generally in the form of circular discs or cylinders, disposed between the ends of the front end mass 22 and the tail mass 26. The piezoelectric elements 28 may be made of a piezoelectric ceramic, or any other suitable piezoelectric material. An electrode member 30 is preferably provided between the piezoelectric elements 28. The illustrated electrode member 30 is in the form of a conductive plate or disc, which is preferably made of metal and may be circular in shape. The piezoelectric elements 28 and the electrode plate 30 are preferably clamped between the front end member 22 and the tail member 26. Such clamping may be produced by a screw member 32, which may take the form of a threaded rod or stud, screwed into tapped axial openings 34 and 36, formed in the front end mass 22 and the tail mass 26. The electrode plate 30 is clamped between the piezoelectric elements 28.

To afford clearance for the clamping screw 32, an axial opening 38 is preferably formed in each of the piezoelectric elements 28. An axial opening 40 is also formed in the electrode plate 30.

Electrical insulation is preferably provided between the axial screw 32 and the electrode plate 30. As shown, such insulation takes the form of a tubular insulating sleeve or bushing 42, mounted around the screw 32, and received within the openings 38 and 40.

In this case, the front end mass 22 is made of conductive material and serves as an electrode to engage one of the piezoelectric elements 28, on the opposite side thereof from the side engaged by the electrode plate 30. The screw 32 provides an electrical connection between the front mass 22 and the tail mass 26. While the tail mass 26 is made of conductive material and could serve as an electrode to engage the other piezoelectric element 28, a thin metal electrode 44 is provided in this case between the tail mass 26 and the adjacent piezoelectric element 28. Electrode 44 may be made of copper foil or any other suitable conductive material. The thin metal electrode 44 makes it easy to establish an electrical connection to the masses 22 and 26. Thus, the illustrated electrode 44 has a terminal tab or projection 46 which is brought out from the main body of the electrode 44, to a point which is readily accessible, so that a lead 48 can readily be soldered or otherwise connected to the terminal tab 46.

The transducer 12 of FIGS. 1 and 2 includes a mounting member 50 which supports the masses 22 and 26, the piezoelectric elements 28 and the electrode plate 30. The mounting member 50 may be made of plastic material, such as nylon, for example, a soft resilient material, such as silicone rubber, or any other suitable material. It is preferred to employ an electrically insulating material. It is preferred to employ an electrically insulating material, because of the need for insulating the electrode plate 30 from the front and tail masses 22 and 26.

As shown in FIG. 2, the mounting member 50 is formed with an opening 52 which slidably receives portions of the masses 22 and 26, while also receiving the piezoelectric elements 28 and the electrode plate 30. In FIG. 2, a definite clearance 54 is shown between the inside of the opening 52 and the outer surfaces of the masses 22 and 26 and the piezoelectric elements 28. This clearance 54 is exaggerated for clarity of illustration. It is desired to provide a sliding fit between the opening 52 and the masses 22 and 26, as well as the piezoelectric elements 28. so as to prevent the mounting member 50 from causing undue damping of the ultrasonic vibrations produced by the piezoelectric elements 28 and transmitted to the masses 22 and 26. The provision of the clearance or sliding fit also prevents the development of any buzzing noises, so that the ultransonic transducer operates without producing any audible sounds. The ultrasonic vibrations themselves are far above the audible range.

The illustrated mounting member 50 is formed with a slot 56 for receiving the electrode plate 30. As illustrated, the slot 56 is in the form of an internal peripheral groove, formed in the mounting member 50 within the opening 52. The slot 56 is shown in FIG. 2 as being large enough to afford definite clearance between the electrode plate 30 and the walls of the slot 56, such clearance being somewhat exaggerated for clarity of illustration. It is desirable to provide a sliding fit between the slot 56 and the electrode plate 30, so as to avoid undue damping of the ultrasonic vibrations.

The retention of the electrode plate 30 in the slot 56 prevents any substantial longitudinal movement of the transducer 12 relative to the member 50, so that the transducer 12 is supported in the desired position. As shown, a lead 58 is soldered or otherwise connected to the electrode plate 30 and is brought out of the mounting member 50 through an opening 60 therein.

As shown in FIG. 1, the mounting member 50 may be made in two complementary parts or halves *62a* and *b* which may readily be fitted around the masses 22 and 26 and the piezoelectric elements 28, so as to facilitate the assembly of the transducer 12 within the opening 52 in the mounting member 50. When the halves or parts *62a* and *b* are separated, it is easy to insert the electrode plate 30 into the groove or slot 56.

In the construction of FIG. 1, the collecting receptacle 18 is formed integrally with the mounting member. Thus, the collecting receptacle 18 is also made in two components or halves *64a* and *b*. The components *62a* and *b* and *64a* and *b* may readily be molded from a suitable resinous plastic material, such as nylon, for example.

The liquid supply pipe 16 is connected to a side pipe 16a which is brought out of the mounting member 50 through an opening 66. Similarly, the drain pipe 20 is brought out of the receptacle 18 through an opening 68 which may be caulked or sealed to prevent leakage of the liquid.

The two halves 62*a* and *b* of the mounting member 50 may be cemented, bonded, or otherwise secured together. Likewise, the two halves **64*a*** and *b* of the collecting receptacle 18 may be similarly joined together.

Generally, the tail mass 26 has a length corresponding to approximately one-quarter the wavelength of the ultrasonic vibrations as propagated in the tail mass. The front end mass 22 generally has a length corresponding approximately to three-quarters of a wavelength of the ultrasonic vibrations, as propagated in the front end mass 22. The reduced end portion 24 generally has a length corresponding approximately to one-quarter wavelength. The ratio between the cross-sectional areas of the front end mass 22 and the reduced portion 24 may be approximately 7 to 1.

The transducer 12 is caused to produce ultrasonic vibrations by applying an alternating or pulsating electrical voltage between the electrode plate 30 and the masses 22 and 26, on opposite sides of the twin piezoelectric elements 28. The electrical voltage should have a frequency which is at or near the resonant frequency of the transducer 12.

FIG. 2 shows an illustrative driver circuit 66 for supplying an alternating electrical voltage to energize the transducer 12. The illustrated driver circuit 66 operates as a self-excited oscillator, comprising an amplifier 68 with feedback to produce sustained oscillations. The amplifier 68 has an input connection **68*a*, an output connection 68*b*, and a common connection 68*c* which serves as the common return terminal for both the input connection 68*a* and the output connection 68*b*. The amplifier 68 may be of any suitable type but preferably is of the solid state type, such as a Darlington transistor amplifier, which actually includes a plurality of coupled transistors, but is illustrated as a single transistor for simplicity of illustration. It is preferred to employ a Darlington transistor amplifier which is packaged as a single module or unit. Such modules are commercially available. However, it is also possible to use a single high gain transistor. However, the commercially available high gain transistors are generally more expensive then Darlington modules. Power to operate the amplifier 68 may be provided by a power supply 70, illustrated as comprising a power transformer 72, a bridge rectifier 74 connected to the output of the transformer 72, and a filter capacitor 76 connected across the output of the bridge rectifier, so as to supply a substantially smooth direct current output. The input of the power transformer 72 may be connected to an alternating current power line by leads 78*a*** and *b* connected to an electrical plug 80. A switch 82 may be connected in series with either of the leads **78*a*** and *b*. The direct current output of the power supply 70 appears between leads **84*a*** and *b*. In this case, the lead **84*b*** is grounded.

The illustrated driver circuit 66 utilizes an output or driver transformer 86 and an input or feedback transformer 88. The transformer 86 has primary and secondary windings **86*a*** and *b*. Similarly, the transformer 88 has primary and secondary windings **88*a*** and *b*.

In this case, the primary winding **86*a* of the output transformer is connected between the power supply lead 84*a* and the output connection 68*b* of the amplifier 68. The common connection 68*c*** is grounded.

The secondary winding **86*b* of the output transformer 86 is connected to the transducer 12. Thus, one side of the secondary winding 86*b* is connected to the transducer electrode lead 58 through a protective resistor 90. The other side of the secondary winding 86*b* is connected to ground, and thus is connected to the grounded lead 48 of the ultrasonic transducer 12**.

The secondary winding of the feedback transformer **88*b* is coupled to the input connection 68a of the amplifier 68. Thus, one side of the secondary winding 88b is coupled to the input connection 68*a* through a coupling capacitor 92. The other side of the secondary winding 88*b* is connected to ground and thus is connected to the grounded common terminal 68*c* of the amplifier 68**.

As shown in FIG. 2, a capacitor 94 is connected across the secondary winding **88*b* to form a parallel resonant circuit which acts as a band-pass filter having its center frequency corresponding closely to the resonant frequency of the transducer 12**.

One side of the primary winding **88*a* is shown as being connected to the electrode lead 58 for the piezoelectric elements 28, while the other side of the primary winding 88*a* is connected to a phase shifting circuit 96. It will be seen that the phase shifting circuit 96 comprises a potentiometer 98, a fixed resistor 100 and a capacitor 102 connected in series across the secondary winding 86*b* of the driver transformer 86. The primary winding 88*a* of the feedback transformer 88 is connected between the slider of the potentiometer 98 and the lead 58 extending to the electrode 30 of the piezoelectric transducer 12. The variable potentiometer 98 makes it possible to adjust the magnitude and phase of the feedback voltage which is supplied by the transformer 88 to the input connection 68*a* of the amplifier 68**.

A biasing voltage for the input connection **68*a* of the amplifier 68 may be provided by a voltage divider, comprising a first resistor 104, connected between the power supply lead 84*a* and the input connection 68*a*, and a second resistor 106, connected between the input connection 68*a*** and ground.

In the simplified representation of FIG. 2, the amplifier 68 is represented as a single transistor having its base connected to the input connection **68*a*; and its emitter connected to the common connection 68*c* which is grounded. It is preferable to employ a composite transistor amplifier, such as a Darlington amplifier, in which case the input connection 68*a* is connected to the input base, while the output connection 68*b* and the common connection 68*c*** are connected to the output collector and emitter.

As shown in FIG. 2, the driver circuit 66 is divided into two modules 104 and 106 which are connected together by disengageable connectors **108*a*** and *b*. The module 104 includes the power transformer 72, the components **78*a*, 78*b*, 80 and 82 in the primary circuit of the transformer 72, and the solid state amplifier 68. The second module 106 includes the other components, such as the bridge rectifier 74, the transformers 86 and 88, the potentiometer 98**, and the various other associated resistors and capacitors.

FIGS. 3–5 show a modified atomizer 110 comprising a transducer 112 which is similar to the transducer 12 of FIGS. 1 and 2, except that the transducer 112 has a modified mounting member 114, which may be made of silicone rubber, or some other suitable material, molded around the piezoelectric elements 28, the adjacent portions of the front and tail masses 22 and 26, and the central electrode plate 30. The mounting member 114 is produced by inserting the transducer 112 into a suitable mold, having a cavity corresponding in shape to the desired shape of the mounting member 114, and molding silicone rubber within such cavity and around the transducer 112. In this way, the mounting member 114 is formed with the electrode 30, the piezoelectric elements 28, and the adjacent portions of the masses 22 and 26 embedded in the mounting member 114.

It has been found that when the silicone rubber is cured, it debonds from and shrinks away from the electrode 30, the piezoelectric elements 28, and the masses 22 and 26, so that a small clearance space is produced between the silicone rubber mounting member 114 and the above mentioned components of the transducer 112. The clearance is similar to the clearances 34 and 56 shown in FIG. 2. The clearance spaces become filled with air, which acts as a lubricant between the silicone rubber mounting member 114 and the various components 22, 26, 28 and 30 of the transducer 112, so as to minimize the damping action of the mounting member 114 on the ultrasonic vibrations. The clearance spaces also prevent the development of any buzzing noises so that the ultrasonic transducer operates without producing any audible noise or sound. The ultrasonic vibrations themselves are inaudible.

As shown in FIGS. 3-5, the mounting member 114 has a central generally cylindrical body portion **114*a* and a pair of generally cylindrical end portions 114*b*** and *c* of reduced diameter. The mounting member 114 may be supported by confining the body member **114*a* between a pair of parallel plates 116, made of plastic, metal or other suitable material. The illustrated plates 116 and openings 116a therein for receiving the reduced end portions 114*b*** and *c*.

Due to the air cushion between the silicone rubber mounting member 114 and the various elements of the transducer 112, there is a sliding fit therebetween which is loose enough to avoid any undue damping of the ultrasonic vibrations.

In this case, the front and tail masses 22 and 26 serve as electrodes on opposite sides of the twin piezoelectric elements 28. The masses 22 and 26 are connected together electrically by the clamping screw 32. The ground lead 48 may be connected to one of the masses 22 by means of a clamping screw 118 taped into one of the masses 22 or 26. In this case, the clamping screw 118 is mounted on the tail mass 26.

In the atomizer 110 of FIGS. 3-5, the liquid to be atomized is delivered to the tip portion 14 of the transducer 112 by a tube or pipe 120. A shroud or ring 122 is connected to the end of the tube 120 and is disposed around the tip portion 14 to confine the liquid and prevent it from escaping before it is atomized. As shown in FIG. 4, the ring 122 is preferably channel-shaped in cross section. Thus, the illustrated ring 122 has an internal channel or groove 124 into which the liquid is delivered by the tube 120. Annular spaces 126 are provided between the tip portion 14 and the ring 122 to provide for the escape of the atomized liquid particles.

FIG. 6 illustrates another modified atomizer 130 which is shown as applied to a carburetor 132 for supplying atomized or vaporized fuel to an engine, or any other device requiring fuel. The atomizer 130 can be used with gasoline or any other liquid fuel.

As shown, the atomizer 130 is mounted within a conduit or housing 134 through which air is supplied to the engine. The stream of air picks up the atomized fuel and carries it into the intake manifold 136 of the engine. A bolt 138 is provided between the conduit 134 and the intake manifold 136.

A valve plate or other member 140 may be provided in the conduit 134 to regulate the flow of air. As shown, the valve plate 140 is carried by a rotatable control shaft 142 which can be operated manually or automatically to change the position of the plate 140, so as to increase or decrease the flow of air.

In this case, the liquid to be atomized is supplied to the tip 14 of the ultrasonic transducer 130 through an axial passage 144 extending within the front end mass 22. As soon as the liquid emerges from the passage 144, the liquid is atomized by the ultrasonic vibrations of the tip 14. The liquid is supplied to the passage 144 by a laterally extending tube 146 which may extend from a pool of the fuel in a tank, or other container. In most cases, the engine produces an intake suction or vacuum which can be employed to suck the liquid fuel from the container and through the tube 146 and the passage 144. However, the liquid can be delivered under pressure through the tube 146 and the passage 144. If desired, a second liquid, such as water, for example, may be supplied to the transducer 130 through a second tube or pipe 147, leading from a source of such liquid. As shown in FIG. 6, the second supply tube 147 is also connected to the axial passage 144, so that both the first liquid and the second liquid are supplied to the vibratory member 14 through the axial passage.

During the operation of an internal combustion engine, it is often advantageous to supply water to the engine, for the purpose of cooling the engine and increasing the power of the engine, due to the conversion of the water into steam within the engine. If desired, the second liquid supply tube 147 may be arranged to supply the second liquid to the outside of the vibratory member 14.

In this case, the transducer 130 is supported by one or more pillars 148, connected between the wall of the conduit 134 and a mounting member 150 on the transducer 130. The mounting member 150 may be similar to the mounting member 114 of FIGS. 3-5 and may be made of silicone rubber or any other suitable material, molded around the transducer 130. The illustrated pillar 148 is tubular so that the electrode lead 58 can be brought out through the pillar.

FIG. 7 illustrates a device 150 for making snow. Such device 150 utilizes one or more atomizers 152 which may be similar to the atomizer 10 of FIGS. 1 and 2, the atomizer 110 of FIGS. 3-5, or the atomizer 130 of FIG. 6. As illustrated in FIG. 7, the snow making device 150 employs four atomizers 152.

Water is supplied to each of the atomizers 152 through the tube 16, as described in connection with FIGS. 1 and 2, and is delivered to the vibratory tip member. The ultrasonic vibrations of the tip member 14 break up the water into a great many extremely small particles or droplets, which are then converted into snow by a stream of frigid air, supplied by a conduit or pipe 154. The air is sufficiently cold to produce rapid freezing of the atomized water particles. The frigid air may be supplied by a blower and a refrigeration system, connected to the pipe 154.

As shown, the atomizers 152 are mounted on the inside of the air discharge pipe 154, near the end thereof. The atomizers 152 extend beyond the end of the pipe 154. The blast of frigid air from the pipe 154 causes the atomized water particles to be converted into snow, and propels the snow for a considerable distance so that the snow can be distributed as desired. The snow making device 150 is well adapted for producing snow for use on ski slopes.

As illustrated in FIGS. 8 and 9, it sometimes is advantageous to supply a plurality of liquids to the ultrasonic vibratory member 14, so that the liquids will be simultaneously atomized and intimately mixed or emulsified. The modified construction of FIG. 8 is similar to the construction of FIGS. 1 and 2, except that a plurality of tubes are provided to supply a plurality of liquids to the vibratory tip member 14 of the transducer. Specifically, FIG. 8 illustrates a second tube 156, in addition to the tube 16, for supplying a second liquid to the vibratory tip member 14.

The modified construction of FIG. 9 is similar to that of FIGS. 3 and 4, except that a plurality of tubes are connected to the channel-shaped ring member 124 for supplying a plurality of liquids to the vibratory tip member 14. In the specific construction of FIG. 9, a second tube 158 is connected to the ring member 124, in addition to the tube 120. A second liquid may be supplied through the tube 158. The modified constructions of FIGS. 8 and 9 will find many applications. For example, oil and water may be supplied simultaneously to the ultrasonic vibratory member, so that both the oil and water will be atomized simultaneously into a cloud of extremely small droplets. The oil and the water are thus effectively emulsified or intimately mixed. The combined oil and water can be used in many ways. For example, the emulsified mixture of oil and water can be applied to carpet material during the weaving of the material, so that the weaving operation is greatly facilitated.

Due to the provision of a plurality of supply pipes for the liquids, it is easy to regulate the quantities of both liquids, supplied to the vibratory member 14, so that the ratios of the liquids can be adjusted as desired. An atomized mixture of oil and water is extremely useful for various lubrication applications, including stamping and drawing operations, as in the manufacture of single bodied cans by drawing operations.

In the operation of the humidifier 10 of FIGS. 1 and 2, water is caused to flow at a controlled rate through the pipe or tube 16, which directs the water upon the outside of the vibratory tip member 14 on the front end mass 12. Intense ultrasonic vibrations are produced in the vibratory tip member 14 by the piezoelectric elements 28. The vibratory ultrasonic energy breaks up the water flow into a cloud of minute water droplets, each measuring less than one-thousandth of an inch across. In fact, the particle size of the water droplets is typically in the range from 30 to 100 microns. These droplets, being so very small, evaporate almost instantaneously into air at the temperature of a furnace plenum. Thus, the ultrasonic humidifier provides very fast control of the humidity of the air. As soon as the ultrasonic transducer is energized, the cloud of extremely small water droplets is propagated into the air, so that the humidity of the air goes up very rapidly.

The transducer 12 of FIG. 1 may produce ultrasonic vibratory energy at a frequency of 28,000 Hz (cycles per second). The water from the water supply pipe 16 flows over a surface area of the vibratory tip member 14 measuring approximately ½ inch square.

The flowing water forms a thin layer of water on the vibratory member 14. The surface of this layer of water, when subjected to the ultrasonic vibrations, becomes crisscrossed with a grid of ripple waves, which may be referred to as capillary waves, that form a mosaic of wave crests numbering, perhaps, 1,000 per linear inch. The crest of each tiny wave breaks off so that each ripple wave produces an extremely small water droplet which is impelled off the surface of the water with the momentum of the wave crest motion. Thus, for each cycle of the ultrasonic vibrations, as many as 1 million minute water droplets are impelled off each square inch of the water layer on the vibratory surface. This action is repeated at the frequency of the ultrasonic vibrations, which may be 28,000 cycles per second, for example. The ultrasonic vibratory frequency may actually be varied over an extremely wide range. The ultrasonic transducer 12 is resonant at the vibratory frequency determined by its geometrical design. Due to such resonance, the intensity of the ultrasonic vibrations at the tip 14 is greatly increased.

The atomization of the water or other liquid by the ultrasonic vibrations is extremely efficient. Large volumes of water can be atomized with only a very small amount of ultrasonic power. For example, up to 100 gallons per day of water can be atomized with only 30 watts of ultrasonic power. Accordingly, the operating cost of the ultrasonic humidifier is very low. This is one of the principal advantages of the ultrasonic humidifier.

A further advantage resides in the fact that the ultrasonic humidifier keeps itself clean and free from lime, due to the intense ultrasonic vibrations which are produced by the ultrasonic transducer. The ultrasonic vibrations prevent any lime from adhering to the vibratory transducer. Thus, the ultrasonic humidifier is not subject to the problems of clogging and liming which have been encountered with other types of humidifiers.

Furthermore, the intense ultrasonic vibrations have been found to kill bacteria with high efficiency. Specifically, it has been found that better than a 99 percent mortality rate is achieved as to any bacteria exposed to the ultrasonic vibrations. Thus, the ultrasonic humidifier has a highly advantageous bactericidal kill action so that the humidified air is purified to a great extent.

If desired, a deodorizing agent may be added to the water which is fed to the ultrasonic humidifier, so that the deodorizing agent will be propagated into the air as the water is atomized. In this way, the ultrasonic humidifier deodorizes the air very effectively. Alternatively, a perfume or other odorizing agent may be added to the water which is supplied to the humidifier, so as to perfume or odorize the air. If desired, the ultrasonic atomizing device may be employed specifically for adding a deodorizing or odorizing agent to the air, without adding water for humidity control. In that case, only the deodorizing or odorizing agent is fed to the ultrasonic transducer.

The ultrasonic humidifier can easily be controlled automatically by an electrical switch system utilizing a humidistat or some other control device, because the operation of the ultrasonic humidifier can be started and stopped, very easily, simply be switching the electrical power to the electronic driver circuit. Thus, the control switch 82 of FIG. 2 may comprise the contacts of a humidistat or other control device. When increased humidity is called for by the control device, the switch 82 is closed. This causes the driver circuit and the piezoelectric elements 28 to produce ultrasonic vibratory energy which immediately causes atomization of the water supplied to the vibratory tip member 14 of the transducer 12.

The ultrasonic transducer 12 is small in size and lightweight. Thus, the ultrasonic humidifier 10 can readily be mounted in any heating or ventilating duct, either horizontal or vertical. The ultrasonic humidifier can be located in a duct which either carries air to or away from the plenum chamber of a furnace. The humidifier can also be located directly in the plenum chamber.

The ultrasonic atomizer can also be used in all other types of humidifiers, such as room type units. Because of the use of solid state electronics, the humidifier is extremely dependable.

The ultrasonic humidifier is well adapted for use in a portable unit for trailers or mobile homes. The humidifier can readily be adapted for use with any collapsible water reservoir.

In fact, the ultrasonic humidifier can be used with any water supply, of any degree of liming or hardness. The humidifier requires very little water pressure, less than one-half pound per square inch. By using a pressure reducing valve, the humidifier can be used with high water pressures, of 100 pounds per square inch, for example.

Because of the small size and compactness of the ultrasonic humidifier, it can be installed in a very small cut out opening in a duct wall or the like. For example, the opening can be approximately 3 × 4 inches.

The water is supplied to the humidifier by a pipe having a sufficiently large bore to obviate any possibility of clogging. The ultrasonic humidifier does not use nozzles or small pipes which might clog up.

If desired, a plurality of ultrasonic atomizers can be employed in parallel to increase the humidification capacity of the combined system to any desired value. The electronic driver unit of FIG. 2 can be employed to operate a plurality of ultrasonic transducers connected in parallel. In this wasy, a capacity of at least 100 gallons per day can be achieved with a single electronic driver unit. Generally, the electronic driver unit requires an input power of less than 75 watts.

The ultrasonic humidifier is completely fail safe. In the event of any malfunction of the ultrasonic transducer or driver unit, the water is carried away to the drain.

The electronic driver circuit of FIG. 2 utilizes only a small number of components, comprising a single discrete Darlington amplifier device, two transformers, five resistors, and three capacitors. The components are employed in a novel bridge circuit which provides the essential feedback loop for sustaining the vibratory oscillations of the ultrasonic transducer at its resonant frequency.

The piezoelectric elements 28 of the transducer and the electrode plate 30 are clamped between the front end mass 22 and the tail mass 26 by the axial screw 32. In addition, it is preferred to employ a high temperature epoxy bonding agent to form permanent bonds in all of the joints in this assembly. The front end mass 22 has a step function of a ratio of approximately 7 to 1 on its front end. This construction greatly increases the intensity of the ultrasonic vibrations at the tip of the transducer, where the liquid to be atomized is applied.

The water supply pipe 16 is inserted into an opening 160 formed in the mounting member or shroud 50. The pipe 16 is connected with the side pipe **16*a* inserted into the opening 66, as shown in FIG. 1. Pipe 16 may be removably connected to the side pipe 16*a*, as by a screw joint, for example, so that the pipe 16** can easily be removed or replaced.

Each of the halves **62*a* and 62*b* of the mounting member or shroud 50 may be molded at low cost in one piece with the corresponding half 64*a* or 64*b* of the water collection receptacle 18.** The material employed may be a suitable plastic, such as high temperature nylon.

The atomizer 110 of FIGS. 3-5 is operated in much the same manner as the atomizer of FIGS. 1 and 2. The liquid to be atomized is supplied through the pipe 120 to the vibratory tip portion 14 of the transducer 112. The channel-shaped ring 122 is connected to the water supply pipe 120 to confine the liquid to be atomized so that the liquid will be guided into engagement with the vibratory tip member 14. If desired, the liquid can be supplied under increased pressure, because of the provision of the ring 122.

In the atomizer 110 of FIG. 3, the mounting member 114 is preferably made of a high temperature silicone rubber, which has the advantage of being flexible. The silicone rubber may be molded around the piezoelectric elements 28, the electrode 30, the adjacent portions of the masses 22 and 26, and the connecting lead 58.

The ultrasonic atomizers of the present invention are capable of atomizing virtually any liquid. For example, the atomizer is well adapted for atomizing molten metals, to produce extremely small metallic particles which can then be solidified, by an air stream or otherwise, to produce powdered metal. If desired, the atomizer droplets of molten metal can be blasted or otherwise propelled, while still molten, upon any desired surface, to metallize the surface.

By way of further example, the ultrasonic atomizer is well adapted for atoizing various paints for use in spray painting. The ultrasonic humidifier produces paint droplets or particles which are extremely small in size. Virtually any liquid coating material can be atomized by the ultrasonic atomizer. Such atomizer is well adapted for use in spray coating substances in which the coating droplets or particles are propelled or controlled by an electrostatic field.

It has been found that the ultrasonic transducers of the present invention are capable of activating various materials or chemical agents. Thus, for example, the ultrasonic vibratory energy developed by the ultrasonic transducer 12 of FIG. 2 is capable of greatly accelerating the bleaching action of bleaching compositions which are employed for bleaching human hair. The vibratory tip portion 14 of the transducer is simply brought close to or into contact with the hair after the bleaching composition has been applied to the hair in the usual manner. The bleaching occurs almost instantaneously when the hair is subjected to the ultransonic vibratory energy produced at the tip portion 14. The ultrasonic vibrations apparently raise the energy level of the bleaching solution or other compositions so that the bleaching action is greatly accelerated.

If desired, a bleaching solution may be supplied to the tip portion 14 of the transducer, so as to be atomized by the ultrasonic vibrations. However, it is found to be highly satisfactory to apply the bleaching solution in the usual way, by wetting the hair with the bleaching solution, following which the ultrasonic vibratory energy is applied to the hair by the ultrasonic transducer, without the use of the water supply pipe 16. It has been found that the ultrasonic vibrations accelerate the bleaching action of all commercially available oxygen releasing bleaches. The bleaching method of the present invention is applicable to substances generally, but is particularly advantageous as applied to human hair.

It has been found that the ultrasonic transducers of the present invention can be employed very advantageously for removing spots and stains from fabric articles such as clothing or the like. In this method of spot removal, a detergent composition is applied to the spot or stain. Ultrasonic vibratory energy is supplied to the area by bringing the vibratory tip portion 14 of the transducer into contact or close proximity with the spot or stained area. It has been found that the ultrasonic energy activates the detergent composition to a great extent so that the spot or stain is removed. The entire fabric article is generally washed or cleaned following the removal of the spot or stain.

It has been found that the ultrasonic transducers of the present invention may be emloyed very advantageously for carrying out erasing operations, by mountng an erasing member on the vibratory tip member 14. The erasing member may be made of rubber or any other suitable abrasive material. When the ultrasonic vibratory energy is being supplied to the eraser, it may be lightly applied to the material to be erased, whereupon the erasure is completed almost instantaneously. Thus, even relatively large areas can be erased very quickly and neatly, with no appreciable damage to the paper or other material on which the erasure is carried out.

Those skilled in the art will understand that various values may be assigned to the electrical components shown in FIG. 2. However, it may be helpful to list the following set of values which have been employed successfully in actual practice:

| COMPONENT | VALUE |
|---|---|
| 76 | 1000 microfarads, 50 volts |
| 90 | 100 ohms |
| 92 | .01 microfarad |
| 94 | .033 microfarad |
| 98 | 150 ohms, 12 watts |
| 100 | 1000 ohms, 10 watts |
| 102 | .0056 microfarads |
| 104 | 100,000 ohms |
| 106 | 10,000 ohms |

It is often advantageous to provide a nonstick wear-resistant coating on the vibratory member 14 of FIG. 2. As illustrated, the vibratory member 14 constitutes the tip portion of the reduced member 24 of the front end mass 22. The nonstick coating may be advantageously made of Teflon. Another alternative is to employ aluminum as the material for the front end mass 12, and to provide the coating in the form of an anodized coating on the aluminum tip portion 14.

The nonstick wear-resistant coating on the tip portion or vibratory member 14 is particularly advantageous when the ordinary tap water is supplied to the vibratory member, so that the water will be atomized by the ultrasonic vibrations, as in the constructions of FIGS. 1, 3 and 7. The nonstick wear-resistant coating will prevent any lime or other minerals in the tap water from sticking to the vibratory member, so that no lime will be accumulated over a long period of time. The coating also prevents any corrosion, discoloration, erosion or wear on the vibratory member 14 due to the action of the water or other liquid applid to the vibratory member.

While Teflon is is particularly advantageous as the coating material, other coating materials, such as other resinous plastic materials, may be employed.

In the electrical circuit of FIG. 2, the power transformer 72 may sometimes be advantageously replaced with a series connected voltage dropping resistor or resistance element, connected in a series circuit with the power lines 78*a* and *b*, the switch 82, and the input terminals of the bridge rectifier 70. The resistance element or resistor has the advantage of being less costly than the power transformer 72. Moreover, it is sometimes advantageous to locate the resistance element on or near the vibratory member 14, so the heat generated by the resistance element is imparted to the water or other liquid which is atomized by the ultrasonic vibrations of the vibratory member 14. Such positioning of the resistance element is particularly advantageous when the ultrasonic transducer device is employed as a component of a humidifier, as illustrated in FIG. 1, for example, or as a component of a device for distilling water or generating steam. The heat developed by the resistance element is imparted to the atomized water and is effective to accelerate the vaporization of the water. For example, the resistance element may be in the form of a length of resistance wire, coiled around the tip portion or vibratory member 14 and electrically insulated therefrom. A coating of Teflon or other similar material may be applied to the coiled resistance wire. The Teflon provides electrical insulation and also acts as a nonstick wear-resistant coating, as previously explained.

As an alternative example, the resistance element may be mounted near the vibratory member 14 and in the path of the atomized water or other liquid, so that the atomized liquid will impinge upon the resistance element. Thus, the heat generated by the resistance element will be imparted to the atomized liquid. The resistance element may be mounted upon or embedded in a supporting plate or other member, positioned near the vibratory member 14 and in the path of the atomized water or other liquid. A nonstick or wear-resistant coating, such as a Teflon coating, is preferably provided on such plate and on the resistance element, so that any lime or other deposit formed on the plate will not stick but will slide off. Such plate is preferably positioned at an inclined or diagonal angle so that the lime or other deposit will slide off the plate with greater facility. Moreover, with the inclined or diagonal position of the plate, the atomized water impinges upon an increased area of the plate. Thus, the transfer of heat from the resistance element to the water is accelerated.

I claim:

1. A device for generating ultrasonic energy, comprising a piezoelectric transducer including at least one piezoelectric element having a pair of electrodes on opposite sides of said element, a solid-state amplifier having input and output connections, a driver transformer having a primary winding connected to said output connections of said solid-state amplifier, said driver transformer having a secondary winding connected to said electrodes of said piezoelectric transducer, a feedback transformer having a secondary winding connected to said input connections of said solid-state amplifier, said feedback transformer having a primary winding, a phase shifting circuit connected between said electrodes and said primary winding of said feedback transformer, and a resonating capacitor connected across said secondary winding of said feedback transformer, said resonating capacitor and said secondary winding of said feedback transformer forming a parallel resonant bandpass filter.

2. A device according to claim 1,
in which said piezoelectric transducer and said parallel resonant bandpass filter have resonant frequencies which are substantially the same.

3. A device according to claim 1,
in which said phase shifting circuit includes a variable element for controlling the magnitude of the feedback signal supplied by said phase shifting circuit to said primary winding of said feedback transformer.

4. A device for generating ultrasonic energy,
comprising a piezoelectric transducer including at least one piezoelectric element having a pair of electrodes on opposite sides of said element,
a solid-state amplifier having input and output connections,
a driver transformer having a primary winding connected to said output connections of said solid-state amplifier,
said driver transformer having a secondary winding connected to said electrodes of said piezoelectric transducer,
a feedback transformer having a secondary winding connected to said input connections of said solid-state amplifier,
said feedback transformer having a primary winding,
a phase shiftng circuit connected between said electrodes and said primary winding of said feedback transformer,
and a resonating capacitor connected across said secondary winding of said feedback transformer,
said resonating capacitor and said secondary winding of said feedback transformer forming a parallel resonant bandpass filter,
said piezoelectric transducer and said parallel resonant bandpass filter having resonant frequencies which are substantially the same,
said phase shifting circuit including a variable potentiometer connected in series with a second capacitor across said electrodes of said piezoelectric transducer,
said potentiometer having a variable output element connected to said primary winding of said feedback transformer to vary the magnitude of the feedback signal supplied to said primary winding of said feedback transformer.

5. A device according to claim 4,
in which said amplifier comprises a transistor amplifer having a plurality of coupled transistors.

6. A device for generating ultrasonic energy,
comprising a piezoelectric transducer including at least one piezoelectric element having a pair of electrodes on opposite sides of said element,
a solid-state amplifier having input and output connections,
a driver transformer having a primary winding connected to said output connections of said solid-state amplifier,
said driver transformer having a secondary winding connected to said electrodes of said piezoelectric transducer,
feedback means including a feedback transformer and a phase shifting circuit connected between said electrodes and said input connections of said solid-state amplifier,
said feedback transformer having primary and secondary windings,
and a resonating capacitor connected in parallel with said secondary winding of said feedback transformer,
said resonating capacitor and said secondary winding of said feedback transformer forming a parallel resonant bandpass filter,
said piezoelectric transducer having a resonant frequency,
said parallel resonant bandpass filter having a resonant frequency corresponding to the resonant frequency of said piezoelectric transducer.

7. A device according to claim 6,
in which said feedback means includes a variable element for controlling the magnitude of the feedback signal supplied to said input connections of said solid-state amplifier.

* * * * *

UNITED STATES PATENT OFFICE
CERTIFICATE OF CORRECTION

Patent No. 4,038,570 Dated July 26, 1977

Inventor(s) Benton A. Durley, III

It is certified that error appears in the above-identified patent and that said Letters Patent are hereby corrected as shown below:

Column 2, line 56, before "upon" insert --rely--

Column 7, line 43, "taped" should be --tapped--

Column 11, line 34, "wasy" should be --way--

Column 11, line 45, "The" should be --These--

Column 12, line 30, "atoizing" should be --atomizing--

Column 15, line 29, "shiftng" should be --shifting--

Signed and Sealed this

*Sixth* Day of *December 1977*

[SEAL]

*Attest:*

RUTH C. MASON
*Attesting Officer*

LUTRELLE F. PARKER
*Acting Commissioner of Patents and Trademarks*